United States Patent [19]

Le Gales

[11] 3,826,953

[45] July 30, 1974

[54] CASE FOR A PLURALITY OF SEMICONDUCTOR DEVICES

[75] Inventor: Maurice Le Gales, Paris, France

[73] Assignee: Thomson-CSF, Paris, France

[22] Filed: Jan. 16, 1973

[21] Appl. No.: 324,144

[30] Foreign Application Priority Data

Jan. 21, 1972 France .............................. 72.2049

[52] U.S. Cl. ........... 317/100, 174/52 S, 317/234 G, 317/234 H

[51] Int. Cl. ............................................ H05k 5/00

[58] Field of Search ....... 317/234 H, 234 G, 234 W, 317/100; 174/52 S

[56] References Cited

UNITED STATES PATENTS

| | | | |
|---|---|---|---|
| 2,745,044 | 5/1956 | Lingel | 317/234 W |
| 3,278,763 | 10/1966 | Grove | 317/234 H |
| 3,320,497 | 5/1967 | Neuf | 317/234 W |
| 3,471,753 | 10/1969 | Burks et al. | 317/234 H |
| 3,483,444 | 12/1969 | Parrish | 317/234 H |

*Primary Examiner*—David Smith, Jr.
*Attorney, Agent, or Firm*—Cushman, Darby & Cushman

[57] ABSTRACT

A novel case is capable to receive a plurality of semiconductor devices.

A case comprises a metallic base and a metallic cover separated one from another by means of a hollow insulating body constituting a receptacle. Said enclosure further comprises an intermediary support located inside said receptacle and carrying itself a certain number of devices which are added to those which are normally soldered to the base of the case.

4 Claims, 5 Drawing Figures

CASE FOR A PLURALITY OF SEMICONDUCTOR DEVICES

The present invention relates to a novel case for several semiconductor devices.

In numerous applications and in particular in microwave work, devices such as varactors, for example, have to be connected in series for improving the efficiency of the system.

It results: a higher operating power so that efficient heat preservation must be provided, and considerable increase in the length of the final components if each device is housed in different cases, and unfortunatly, it is well-known that the sizes of component must be very small in relation to the operating wavelength to avoid the appearance of highly undesirable resonance phenomena.

The invention relates to a case for receiving the highest possible number of individual semiconductor devices in a minimum space so that said semiconductor devices are soldered to an appropriate insulating support located into said case so that said semiconductor device are electrically interconnected one another and thermally connected by means of said support to said case.

According to the present invention, there is provided a case for semiconductor devices comprising at least an assembly constituted of a first metallic base and a metallic cover, an insulating hollow body for separating said base from said cover and constituting a receptacle capable to receive at least a first semiconductor device having one terminal, a part of said base being electrically connected with said one terminal; said case further comprising at least one insulating heat conductive support located inside said receptacle, having a first face secured to said first base and a second face opposite to said first face; at least one area of said second face being metallised to receive at least one second semiconductor device.

The invention will be better understood from a consideration of the following explanations and the attached drawings in which.

Figure 1:
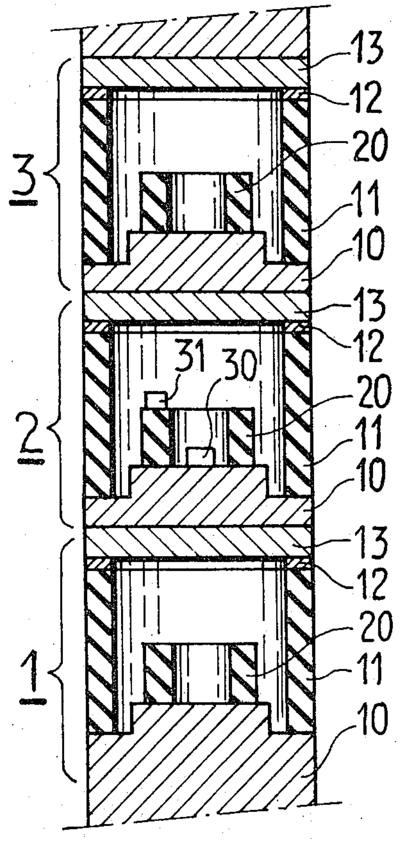
FIG. 1 is a schematic illustration of an assembly of cases in accordance with the invention.

A set of three cases 1, 2, 3 is illustrated in FIG. 1.

In fact, the example is in no way a limitative one and the invention is equally valid whether it is a component with a single case or with *n* cases, *n* being an arbitrary number, which is concerned. Each of these cases is constituted, in a manner known per se by a base 10, a hollow body 11 of insulating material constituting the receptacle of the case and by a cover 13 stuck to the body 11 by means of a metal layer 12.

In accordance with the invention, each of the case comprises a support 20 secured to the base 10 and positioned inside said case. Said support 20 is essentially characterised by its shape and its type:

Its shape should be such that it makes it possible, on the one hand, to solder to the base 10 of the case at least one semiconductor device, a diode 30 for example, and on the other hand to solder at least one other device, such as a second diode 31, to the support 20 itself, or to a second base (not shown in FIG. 1) carried by said support 20.

It should electrically insulate the first device or device 30, from the second device or device 31; on the other hand, it should enable heat exchange to take place between the second device or device 31, and the base 10.

These conditions are satisfied if the support 20 is made for example in the form of a ring of beryllium oxide, this having good thermal conductivity but being an electrical insulating material.

In FIGS. 2, 3, 4 and 5, a number of combinations of devices within a single case accordance with the invention, have been illustrated.

The support 20 is, for example, a ring of beryllium oxide BeO and the devices are junction diodes such for example as varactors.

These cases thus equipped, can then be assembled to one another in the manner hereinbefore described (FIG. 1).

Figure 2:
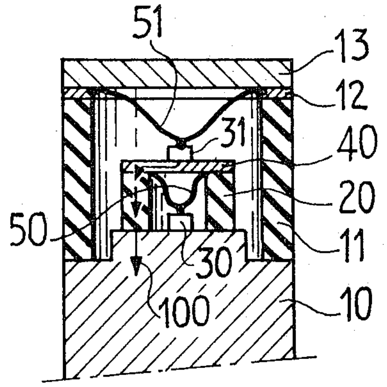
FIGS. 2 to 5 are schematic illustrations of different variant embodiments of stacks of semiconductor devices within a case in accordance with the invention.
Figure 3:
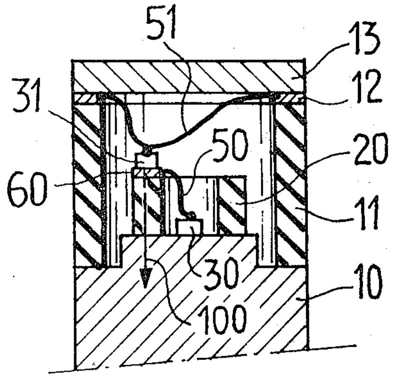

The cases in FIGS. 2 and 3, contain two diodes 30 and 31.

In FIG. 2, the first diode 30 is soldered to the base 10 and the second diode 31 to a second metallic base 40, integral with the top face of the beryllium oxide ring 20.

The first electrode of the diode 30 is electrically connected and thermally connected to the base 10 which is a good thermal conductor. The second electrode of the diode 30 is electrically connected to the second base 40, by the lead 50. The first electrode of the diode 31 is connected electrically and thermally, to the base 40 which itself is connected in a heat transferring manner to the base 10 by means of the support 20.

The second electrode of the diode 31 is electrically connected to the metal cover 13 of the case by the lead 51.

The heat dissipation of the second diode 31 is effected, as the arrow 100 shows, through the base 40 and the BeO ring 20, to the base 10.

In FIG. 3, the first diode 30 is assembled in exactly the same way as in the case shown in FIG. 2. The lead 50 is connected to a metal layer 60, directly deposited upon the ring 20 of BeO. The second diode 31 is electrically and thermally connected to the metallised area 60 and its thermal dissipation, as in the case of the preceding Figure, follows the trajectory illustrated by the arrow 100. The second electrode of the diode 31 is connected to the cover 13 by means of lead 51.

Figure 4:
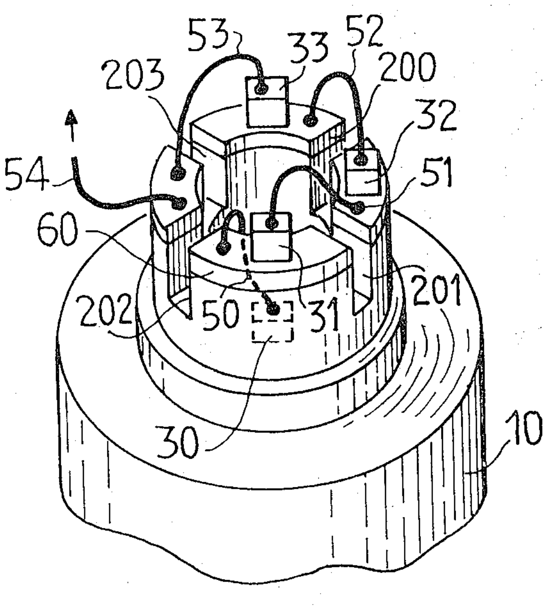

In the case shown in FIG. 3, a single diode 31 is soldered to the BeO ring 20 but, as FIG. 4 shows, this number could be higher and could reach as many as 2, 3, 4 in the FIG. 4 or even more, depending upon the size of the beryllium oxide ring.

In FIG. 4, only the detail of the stack of diodes has been shown: the diode 30 is electrically and thermally connected to the base 10.

The electrical conductivity of the metallised layer 60 is locally interrupted, for example by means of saw cuts as shown at 200, 201, 202, 203 in the FIG. 4, isolating the conductive areas to which the diodes 31, 32, 33 . . . are soldered.

The lead 50 connects the second electrode of the diode 30 to one of the conductive areas, for example that carrying the diode 31. The second electrode 51 of the diode 31 is connected to the next conductive area, to which the diode 32 is soldered. Similarly, the second electrode of the diode 32 is connected by means of the lead 52 to the conductive area carrying the diode 33, and finally, the second electrode of the diode 33 is connected by the lead 53 to a metallised area, carrying a lead 54 which connects the complete stack of series-connected diodes, to the cover of the case itself, which has not been shown in FIG. 4.

The dissipation of the heat generated by each of the diodes during operation, is effected through the ring 20 of BeO, to the base 10 which is a good thermal conductor.

Figure 5:
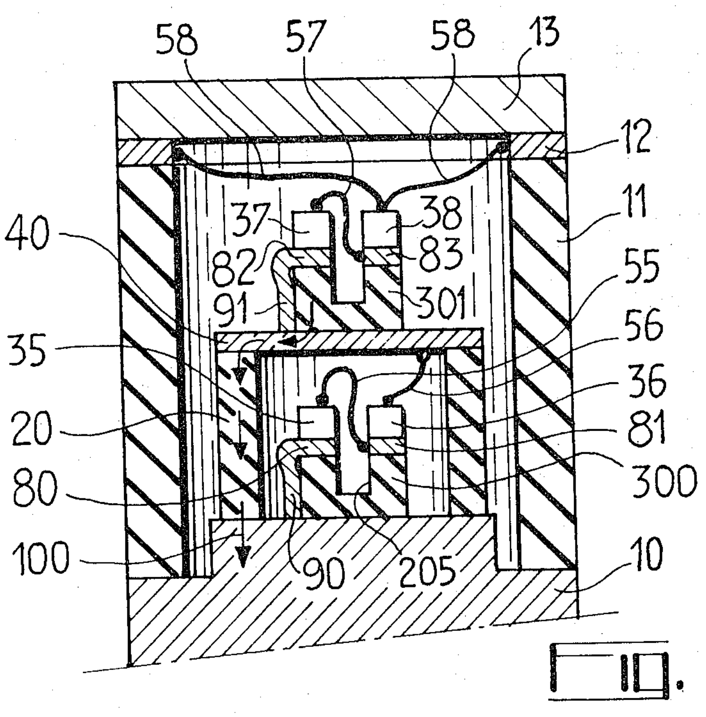

Another variant embodiment in accordance with the invention has been shown in FIG. 5. A stud 300 of material having good thermal conductivity but which is electrical insulator, such for example as beryllium oxide BeO, is stuck to the case. The stud 300 is covered in a manner known per se, with a metal layer in which one or more saw cuts 205 electrically insulate conductive areas 80 and 81 from one another. In the example described, which is in no way limitative, the conductive areas 80 and 81 are two in number and to them there are respectively soldered two diodes 35 and 36. The second electrode of the diode 35 is electrically connected to the conductive area 81, by the lead 55, whilst the lead 56 connects the second electrode of the diode 36 to a second metal base 40 stuck to the top surface of the ring 20. To the second metal base, 40, there is stuck a second stud 301 of BeO, similar to the first one 300 and equipped, like the latter, with two metallised areas 82 and 83 carrying diodes 37 and 38 respectively. The second electrode of the diode 37 is electrically connected by the lead 57 to the metallised area 83 carrying the diode 38, the latter itself being connected by the lead 58 to the cover 13 of the case. Two metallised areas 90 and 91 provide electrical connections respectively between the first terminal of the diode 35 and the base 10, and the first terminal of the diode 37 of the base 40. Heat dissipation from the diodes 37 and 38 is ensured, as the arrow 100 indicates, across the different metal layers and the beryllium oxide, to the base 10.

What I claim is:

1. A case for semiconductor devices comprising at least one assembly constituted of a first metallic base and a metallic cover, a first insulating hollow body for separating said base from said cover and constituting a receptacle capable to receive at least a first semiconductor device, a part of said base being electrically connected with said first device; said case further comprising at least a second hollow body having the shape of a ring made of insulating heat conductive material, constituting a support located inside said receptacle, having a first face secured to said first base and a second face opposite to said first face; at least one area of said second face being metallized to receive at least one second semiconductor device.

2. A case according to claim 1 further comprising a second metallic base secured to said second face and capable to carry a third insulating heat conductive hollow body.

3. A case according to claim 1, further comprising at least an insulating heat conductive stud having a lower face secured to said first base inside said support, and an upper face, said upper face of said stud having at least a metallized zone to receive at least a third semiconductor device, said metallized zone being electrically connected with said first base.

4. A case according to claim 1, further comprising a plurality of semiconductor devices carried by said base and said support, interconnected with one another, first electrode of first device being connected to said first base, and second electrode of at one last of said plurality of devices being connected to said cover.

* * * * *